United States Patent [19]

Fredrickson

[11] Patent Number: 5,691,993
[45] Date of Patent: Nov. 25, 1997

[54] RATE 4/5 TRELLIS CODE FOR PR4 CHANNELS WITH IMPROVED ERROR PROPAGATION

[75] Inventor: Lisa Fredrickson, Ojai, Calif.

[73] Assignee: Seagate Technology, Inc., Scotts Valley, Calif.

[21] Appl. No.: 483,117

[22] Filed: Jun. 7, 1995

[51] Int. Cl.[6] .................................................... G11B 20/18
[52] U.S. Cl. ................................................................ 371/38.1
[58] Field of Search ................................. 371/37.1, 37.4, 371/40.1, 38.1, 39.1, 37.6

[56] References Cited

U.S. PATENT DOCUMENTS

| | | | |
|---|---|---|---|
| 4,544,962 | 10/1985 | Kato et al. | 360/40 |
| 4,707,681 | 11/1987 | Eggenberger et al. | 340/347 |
| 4,751,590 | 6/1988 | Wilkinson | 360/19.1 |
| 5,208,834 | 5/1993 | Fredrickson | 375/25 |
| 5,257,272 | 10/1993 | Fredrickson | 371/43 |
| 5,263,030 | 11/1993 | Rotker et al. | 371/39.1 |
| 5,280,489 | 1/1994 | Fredrickson et al. | 371/45 |
| 5,327,440 | 7/1994 | Fredrickson et al. | 371/43 |
| 5,329,535 | 7/1994 | Coker | 371/39.1 |

FOREIGN PATENT DOCUMENTS

| | | |
|---|---|---|
| 0 322 078 A1 | 6/1989 | European Pat. Off. . |
| 0 364 299 A2 | 4/1990 | European Pat. Off. . |

OTHER PUBLICATIONS

Blaum, "Combining ECC with Modulation: Performance Comparisons", IEEE Trans. on Information Theory, vol. 37, No. 3, May 1991, pp. 945–949, May 1991.

Weldon, "Coding Gain of Reed–Solomon Codes on Disk Memories", Supercomm/ICC '92, pp. 1369–1374, Dec. 1992.

Knudson et al., "A Concatenated Decoding Scheme for (1–D) Partial Response with Matched Spectral–Null Coding", Globecom '93, pp. 1960–1964, Dec. 1993.

Hole et al., "Improved Coding Techniques for Precoded Partial–Response Channels", IEEE Trans. on Information Theory, vol. 40, No. 2, Mar. 1994, pp. 482–493.

Swanson, "An Alternative Construction of Interleaved RLL codes for Partial Response Channels Using Multichannel Methods", IEEE Transactions on Magnetics, vol. 30, No. 5, Sep. 1994, pp. 2769–2777.

"Constructions of Reduced Truncation Depth Trellis Codes for Magnetic Recording" IBM Corporation, P. Siegel, pp. 239–253.

"Matched Spectral–Null Codes for Partial–Response Channels" IEEE Transactions on Information Theory, Razmik Karabed and Paul H. Siegel, vol. 37, No. 3, May 1991, pp. 818–855.

"Modulation and Coding for Information Storage", IEEE Communications Magazine, Paul H. Siegel and Jack K. Wolf, Dec. 1991, pp. 68–86.

"Design and Performance of a VLSI 12MB/s Trellis–Coded Partial Response Channel" IBM Corporation, G. Christiansen, L. Fredrickson, R. Karabed, J. Rae, Shih–Ming Shih, P. Siegal, H. Thapar.

"Improved Trellis–Coding for Partial Response Channels", IBM Corporation, L. Fredrickson, R. Karabed, J. Rae, P. Siegel, H. Thapar, R. Wood.

Primary Examiner—Stephen M. Baker
Attorney, Agent, or Firm—Kinney & Lange

[57] ABSTRACT

A digital communication apparatus transmits sectors of digital values that include error correction values used to detect and correct errors within the sector. Each sector consists of a number of blocks and the error correction values of each block are useful in correcting up to a maximum number of erroneous digital units in that block. The digital communication apparatus encodes the blocks of digital units to transmit them through a channel and then decodes the channel's representation of those encoded blocks, where the channel's representation occasionally contains burst errors. The encoding and decoding is performed in a manner that reduces the number of consecutive erroneous digital units caused by any one burst error to a number less than the number of blocks in a sector, ensuring that the error burst corrupts at most one digital unit in each block.

13 Claims, 8 Drawing Sheets

RATE 4/5 TRELLIS CODE FOR PR4 CHANNELS WITH IMPROVED ERROR PROPAGATION

BACKGROUND OF THE INVENTION

The following U.S. Patents and Pending Patent Applications are hereby incorporated by reference:

U.S. Pat. No. 5,257,272 to L. Fredrickson and entitled "TIME-VARYING MODULO N TRELLIS CODES FOR INPUT RESTRICTED PARTIAL RESPONSE CHANNELS".

U.S. Pat. No. 5,327,440 to L. Fredrickson et al. and entitles "VITERBI TRELLIS CODING METHODS AND APPARATUS FOR A DIRECT ACCESS STORAGE DEVICE".

U.S. Pat. No. 5,208,834 to L. Fredrickson and entitled "LEXICOGRAPHICAL ENCODING AND DECODING OF STATE-DEPENDENT CODES".

U.S. Pat. No. 5,280,489 to L. Fredrickson et al. and entitled "TIME-VARYING VITERBI DETECTOR FOR CONTROL OF ERROR EVENT LENGTH".

Pending U.S. patent application Ser. No. 08/180,567 to Kinhing Tsang and entitled "METHOD AND APPARATUS FOR IMPLEMENTING RUN LENGTH LIMITED CODES IN PARTIAL RESPONSE CHANNELS."

The present invention relates to digital communication systems and more particularly to digital communication systems that use multiple levels of encoding to protect user data as it passes through a noisy communications channel.

Digital communication systems are designed to transmit user data in some digitized form from a source to a destination receiver. The means coupling the source and destination receiver can be a simple conducting wire, a global satellite system or a magnetic storage system. The coupling means is often generalized as a channel between the source and destination.

All channels occasionally introduce electronic noise and distortion into the signals they carry. The electronic noise and the distortion change the transmitted digital signal and thus can create errors within the output. To protect the information in the transmitted digital signals as they pass through the channel, encoding and decoding systems have been developed that add additional bits to the digital signal to be transmitted so that the original signal may be recovered even if the channel introduces errors. In some communication systems, multiple levels of encoding are used, meaning that the original digital signal is encoded more than once before being passed through the channel.

An example of a multiple-level encoding system is found in the encoding system used in storing and retrieving data from some magnetic storage devices. In these systems, the user data is first encoded using an error correction code (ECC) and then further encoded using some form of trellis code. In the ECC encoding process, the user data is typically broken into bytes of digital values where each byte represents one unit of user data. For example, user data may be grouped together in blocks containing 175 bytes of user data and 5 bytes of ECC redundancy. The 5 bytes of ECC redundancy are chosen based on the digital values found in the 175 user bytes. Typically, 5 bytes of ECC redundancy can correct up to two erroneous user bytes in each block. The ECC encoding system is completed by interleaving three separate blocks in a sector containing 540 bytes by transmitting, one after the other, a corresponding byte from each block and doing so repeatedly until all the bytes have been transmitted. Thus, the complete set of user bytes and ECC bytes for any one block can be found by sampling every third byte of the interleaved sector. This is often referred to as a three-way bytewise interleave.

Interleaving reduces the effects of burst errors on the ECC encoded signal. Burst errors are short duration error events affecting one or more consecutive user bytes. By ensuring that consecutive words in the ECC encoded signal are not from the same block, interleaving reduces the chance that a burst error will affect more than one byte in a block. Since ECC can typically only correct two user bytes per block, interleaving reduces the chances that a burst error will exceed the maximum number of user bytes that can be corrected.

In prior art coding methods for magnetic storage devices, the interleaved ECC encoded values are further encoded by two parallel trellis encoders, which receive a series of ECC encoded values. The trellis encoders provide an additional level of coding protection by converting the ECC encoded values into larger codewords. By increasing the number of bits in each codeword, the trellis encoders increase the difference, also known as the distance, between codewords, making it more likely that the proper codeword will be identified at the output.

In addition, some trellis encoders produce Matched Spectral Null (MSN) codes, which affect the frequency content of the encoded signal. A signal's frequency content, also referred to as its spectral power density, is the relative distribution of the signal's power among its constituent frequencies. A signal does not have a frequency as a constituent frequency if the signal's spectral power density has a value of zero at that frequency.

With a Matched Spectral Null (MSN)code, the encoded signal is controlled so that it lacks constituent frequencies which are blocked or nulled by the channel. Such nullifying arises as part of the channel's frequency, or spectral, response, which is a measure of the channel's gain as a function of frequency. The channel has a null when its gain drops to zero at a particular frequency.

Examples of channels with nulls in their spectral responses include computer disc drives, which are often driven by recording frequencies that cause the drives to null or block input signals at zero frequency (D.C.) and one-half the recording frequency, a frequency also known as the Nyquist Frequency. To match a computer disc drive's spectral nulls, a MSN code creates an encoded signal that does not include D.C. or the Nyquist frequency. In other words, the encoded signal's spectral power density has zero's at D.C. and the Nyquist Frequency.

The spectral response described above for disc drives is found in a number of channels referred to generally as a class-IV partial response channels or PR4 channels. These channels are represented by a transfer function $h(D)=(1-D^2)$ where h(D) represents the output of the channel, 1 represents the input signal, and $D^2$ represents the input signal delayed by two recording frequency time units.

A common way to create a Matched Spectral Null (MSN) code for a PR(4) channel is to construct two MSN code sequences which match the spectral nulls of a dicode channel. A dicode channel has a transfer function $h(D)=(1-D)$, where h(D) represents the output, 1 represents the input signal and D represents the input signal delayed by one time unit. Such a channel has nulls at zero frequency and at the recording frequency.

By interleaving the bits of two signals which match the dicode nulls, a signal which matches the nulls of a PR(4)

channel is created. Bitwise interleaving creates such a signal because the signals that match the dicode channel have a spectral power density of zero at the recording frequency and interleaving cause this zero to be shifted to one-half the recording frequency.

The two interleaved signals can be constructed using two trellis encoders in parallel with each other. In the prior art, the interleaved ECC encoded values are assigned to the parallel trellis encoders by first assigning the even bytes to one trellis encoder and the odd bytes to the other trellis encoder. Such alternating assignments are chosen because they are easily implemented. With 12/15 trellis encoders, which convert 12 bits of ECC encoded values into 15-bit codewords, each trellis encoder uses 12 bits at a time from the ECC encoded and interleaved bytes assigned to it to create 15-bit trellis encoder codewords. This means that each trellis encoder uses one full byte and one half byte of the ECC encoded bytes to create one trellis encoder codeword. Thus, the odd byte trellis encoder uses all of byte 1 and half of byte 3 of the ECC encoded bytes to make a first odd trellis encoder codeword and the other half of byte 3 and all of byte 5 to make a second odd trellis encoder codeword. Likewise, the even byte trellis encoder uses all of byte 0 and half of byte 2 to make a first even trellis encoder codeword.

The codewords produced by each trellis encoder are created in parallel so that the bits of the two parallel codewords may be interleaved at the encoders' outputs by transmitting, one after the other, a corresponding bit from each codeword and doing so repeatedly until all the bits have been transmitted. The series of interleaved codewords is transmitted through the channel where it is occasionally corrupted by burst errors. The burst errors usually affect two or more consecutive bits and, because of the interleaving, corrupt two or more 15-bit codewords.

After being retrieved from the channel, a deinterleaver reconstitutes the original trellis encoder codewords and sends these individual codewords to detectors to be decoded into estimations of the ECC encoded signal. Since each interleaved pair of codewords is constructed from four bytes of ECC encoded data, the corruption of an interleaved pair of codewords by a burst error results in the corruption of four bytes of such data. For example, one corrupted codeword may lead to both bytes 1 and 3 being corrupted and the other corrupted codeword may mean bytes 0 and 2 are corrupted. The fact that a single burst error can corrupt four separate bytes is significant because every third byte of a sector's ECC encoded signal is from a single block of ECC encoded information. Thus, in the example above, corrupted bytes 0 and 3 are from the same block. This means that one burst error can corrupt two bytes from the same block. Because ECC can only correct two erroneous bytes in a block, this one burst error has consumed the ECC's entire ability to correct corrupted data. If two burst errors occur in the same sector, corrupting a total of four codewords, the ECC decoder will not be able to correct the corrupted data because more than two bytes of ECC encoded data will be corrupted in a single ECC block.

SUMMARY OF THE INVENTION

The present invention is a digital communication apparatus for transmitting sectors of digital bytes through a channel. Each sector contains a number of error correction coded blocks, each of which contain error correction bytes used to detect and correct errors within the block. The error correction system is capable of correcting up to a maximum number of erroneous bytes per block. The digital communication apparatus includes an encoding system that encodes the blocks of digital bytes so that a single burst error of limited duration in the channel corrupts at most one byte in each block.

In one preferred embodiment, the present invention uses a multi-level encoding scheme where the first level of encoding uses an ECC encoder with three-way bytewise interleave. The three-way bytewise interleave combines bytes from three different ECC blocks so that every third byte is from the same block. Each block of the ECC encoded data contains ECC values that can correct up to two erroneous bytes in that block.

The second level of encoding uses two parallel 12/15 trellis encoders. Each trellis encoder takes 12 bits from the ECC encoder and produces a 15-bit codeword. The two 15-bit codewords are then bitwise interleaved.

Since each trellis encoder needs 12 bits of ECC encoded data to produce one codeword, 24 bits of ECC encoded data are needed to produce the two interleaved codewords. The present invention ensures that all twenty-four bits come from only three bytes of ECC encoded data.

With the present invention, a burst error that corrupts two interleaved codewords corrupts at most 3 bytes of ECC encoded data. Since each of the 3 bytes is part of a separate ECC block, the burst error only affects one byte in each block. Since the ECC system can correct up to two corrupted bytes, the present invention can correct data corrupted by as many as two short duration burst errors. Thus, the present invention can accept twice as many burst errors in the channel as the prior art.

DETAILED DESCRIPTION OF THE PREFERRED EMBODIMENTS

Figure 1:
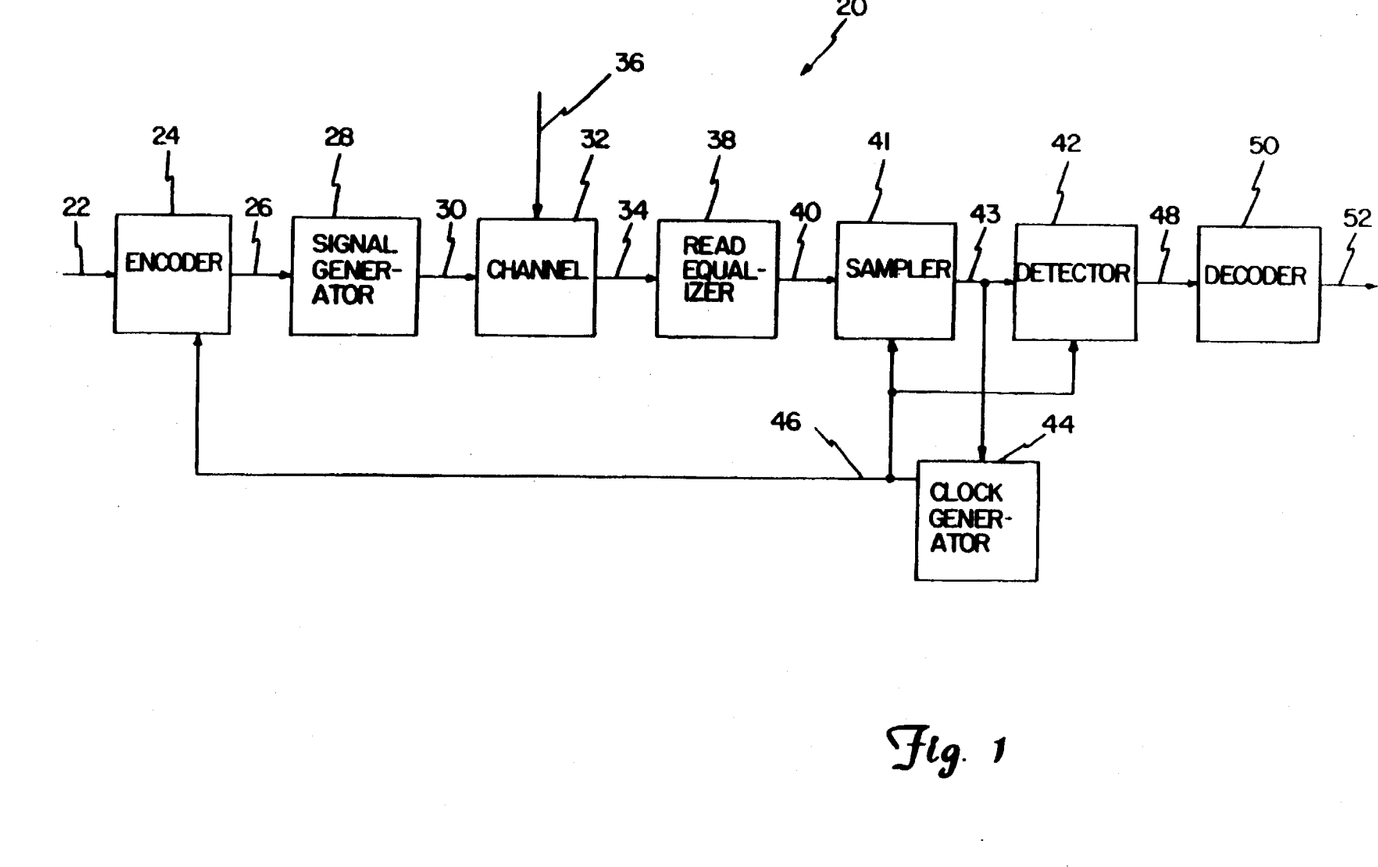
FIG. 1 is a block diagram of a digital communication system of the present invention.

FIG. 1 is a block diagram of a preferred embodiment of the present invention in which the present invention is utilized in a direct access storage device, such as a magnetic disc drive. Digital communication apparatus 20 receives USER DATA 22, passes it through a channel 32 and retrieves it as RECOVERED DATA 52. When used in a magnetic disc drive, channel 32 is a magnetic disc storage and retrieval apparatus for writing information to the magnetic disc by altering localized magnetic fields on the disc and reading information from the disc by sensing the localized magnetic fields.

USER DATA 22 is received by encoder 24 which encodes the user data to better assure recovery of the data from channel 32. Encoder 24 produces ENCODED DATA 26 based upon an encoding process that uses encoding rules appropriate for channel 32. The encoding rules are chosen as a balance between recoverability and transmission efficiency. Enough code bits should be added to ensure recovery of USER DATA 22, but the encode rule should not burden the channel with unnecessary code bits.

Signal generator 28 converts ENCODED DATA 26 into WRITE signal 30, which is an input signal waveform having characteristics suited for channel 32. In the case of a magnetic storage device, channel 32 includes a means for writing and reading magnetic information to and from a magnetic disc. The magnetic information written to the disc is based upon WRITE signal 30. The information read from the disc is found in READ signal 34, the output of channel 32. Due to imperfections in the magnetic disc and errors in writing and reading, channel 32 introduces NOISE 36 into the storing and retrieving process which appears in READ signal 34. This noise usually occurs in short duration bursts that often affect short portions of READ signal 34.

READ signal 34 is input to read equalizer 38 which modifies READ signal 34 by filtering some noise and by shaping the pulses of READ signal 34 so that they more closely match a PR4 channel output. In a perfect PR4 channel, the output signal is equal to the input signal minus the input signal delayed by two synchronizing or "clocking" signal time units. This relationship is sometimes described using the transform $h(D)=(1-D^2)$ where "1" is the input signal and $D^2$ is the input signal delayed by two time units. In magnetic disc drives, the typical input data frequency and the channel's spectral response cause the channel output signal to be similar to a PR4 channel output, but not an ideal PR4 output. Read equalizer 38 simply improves upon this output to create a more ideal PR4 signal. The PR4 channel output of read equalizer 38 is EQUALIZED signal 40 which is input to sampler 41.

Sampler 41 receives BIT CLOCK 46 as a clocking signal from clock generator 44, and samples EQUALIZED signal 40 at times synchronized by this clocking signal, to produce one digital sample per clock cycle. Each digital sample is preferably taken from the center of an expected data bit in EQUALIZED signal 40. The sequence of digital samples produced by sampler 41 over time is output as DIGITAL SAMPLES 43.

In addition to synchronizing the execution of DIGITAL SAMPLES 43, clock generator 44 uses DIGITAL SAMPLES 43 to create BIT CLOCK 46. In a disc drive, clock generator 44 typically contains timing control logic that synchronizes the clock's transitions to pulses created by read synchronization fields stored on the magnetic disc. The pulses create a fixed frequency pattern in EQUALIZED signal 40 and DIGITAL SAMPLES 43. This fixed frequency is used by the timing logic to set the phase and frequency of BIT CLOCK 46 so that it matches the phase and frequency of the significant data values within EQUALIZED signal 40.

Detector 42 receives DIGITAL SAMPLES 43 and BIT CLOCK 46 and uses the digital samples to select codewords that the series of samples most likely represent. The samples are usually in the form of an imperfect PR4 channel output. They are imperfect because they are often corrupted by NOISE 36 and distortion in channel 32. Detector 42 reconstructs codewords from these imperfect samples by comparing the series of samples against possible codewords and selecting the most similar codeword. The technique for performing this comparison is discussed further below. Once Detector 42 has selected a codeword it passes the codeword to decoder 50 as SELECTED CODEWORDS 48.

Decoder 50 uses the inverse of encode rules of encoder 24 to decode each codeword in SELECTED CODEWORDS 48. The decoding is synchronized with the production of SELECTED CODEWORDS 48 by BIT CLOCK 46. This decoding process produces RECOVERED DATA 52.

Figure 2:
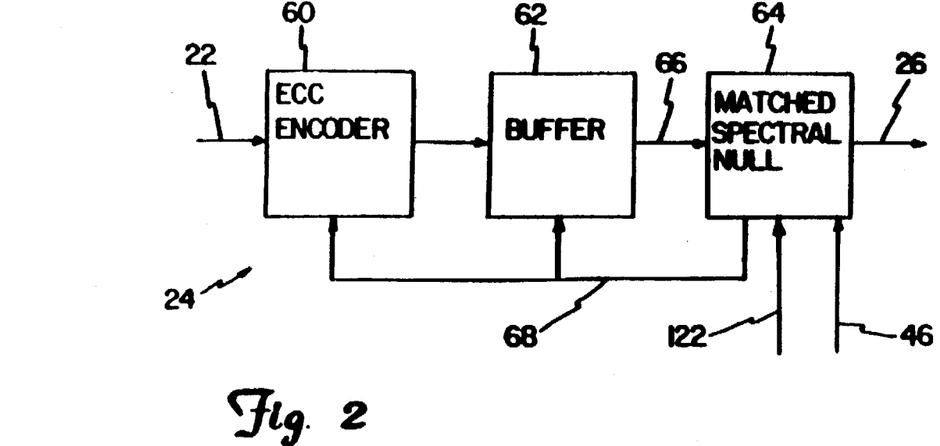
FIG. 2 is a block diagram of encoder 24 of FIG. 1.

FIG. 2 shows a more detailed block diagram of encoder 24 of FIG. 1. USER DATA 22 received by encoder 24 is input to ECC encoder 60. ECC encoder 60 divides the user data into bytes of data and creates further ECC code bytes based on these data bytes. ECC encoder 60 stores the user data bytes and the ECC code bytes in interleaver buffer 62.

The user data and ECC bytes stored in interleaver buffer 62 are passed to matched spectral null encoder 64 as INTERLEAVED ECC DATA 66. The values from interleaver buffer 62 are interleaved in a manner described below in reference to FIG. 3.

Matched spectral null encoder 64 receives BIT CLOCK 46 from clock generator 44 of FIG. 1 and WRITEGATE 122 as a control signal from control logic (not shown). Encoder 64 uses the bit clock to generate BYTE CLOCK 68 that controls the timing of the bytes in INTERLEAVED ECC DATA 66. BYTE CLOCK 68 also controls the production of bytes by ECC encoder 60. Matched spectral null encoder 64 encodes the values in INTERLEAVED ECC DATA 66 into a series of interleaved codewords that appear in ENCODED DATA 26. The encoding is performed in such a manner that in the preferred embodiment only three bytes of INTERLEAVED ECC DATA 66 are used in the production of two interleaved codewords. Because of this limitation, if a channel burst error compromises two interleaved codewords, it will only affect three bytes of INTERLEAVED ECC DATA 66.

Figure 3:
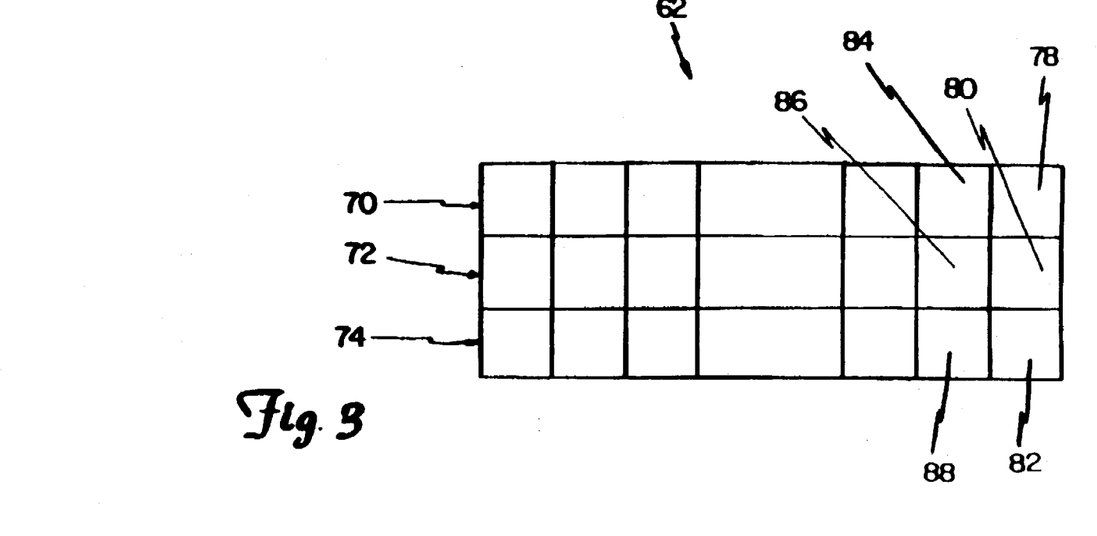
FIG. 3 is a matrix of the contents of buffer 62 of FIG. 2.

FIG. 3 is a representation of a plurality of memory locations in interleaved buffer 62. In the representation, interleaved buffer 62 is a typical block code interleaver that has its memory locations represented by showing them allocated into rows and columns of memory locations, each memory location capable of storing one byte of information. Rows 70, 72 and 74 each represent separate blocks of data bytes and associated ECC bytes.

To create INTERLEAVED ECC DATA 66 from the values stored in interleaved buffer 62, bytes of both data and ECC code are retrieved from buffer 62 in the following sequence. The first byte in row 70 marked as user byte 78 becomes the first byte on INTERLEAVED ECC DATA 66. The first data byte in row 72, marked as user byte 80 becomes the second byte read from buffer 62. The third byte is user byte 82 from row 74. This process of taking one byte from each of the three rows continues in the next bytes where user bytes 84, 86 and 88, taken from rows 70, 72, and 74 become the fourth, fifth and sixth bytes respectively. This process continues until all of the user bytes and all of the ECC bytes have been interleaved and sent to matched spectral null encoder 64.

Figure 4:
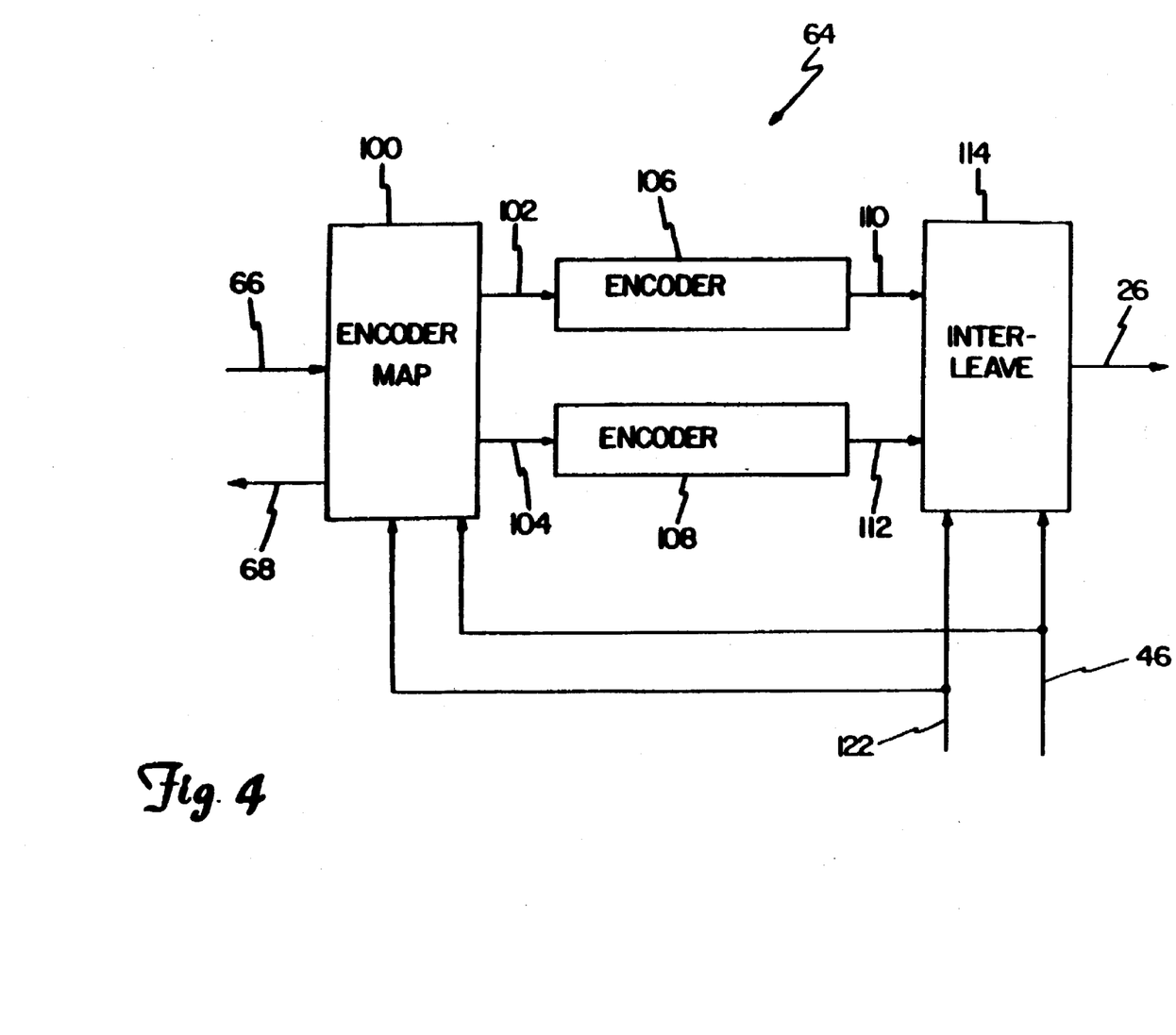
FIG. 4 is a block diagram of matched spectral null encoder 64 of FIG. 2.

FIG. 4 is a block diagram of matched spectral null encoder 64 of FIG. 2. An encoder map 100 receives INTERLEAVED ECC DATA 66 from interleaver buffer 62, as well as BIT CLOCK 46 from clock generator 44 and WRITEGATE 122 from control logic (not shown). Encoder map 100 uses BIT CLOCK 46 to generate BYTE CLOCK 68 and assigns INTERLEAVED ECC DATA 66 to two separate sequences of multi-bit data, TOP SEQUENCE 102 and BOTTOM SEQUENCE 104.

In a preferred embodiment, TOP SEQUENCE 102 and BOTTOM SEQUENCE 104 are sequences of twelve-bit values, with any one twelve-bit value in TOP SEQUENCE 102 associated with a twelve-bit value in BOTTOM SEQUENCE 104. The two associated twelve-bit values are preferably assigned from three consecutive bytes (twenty-four bits) of INTERLEAVED ECC DATA 66. For the purposes of this invention, it does not matter how the twenty-four bits are divided into the two twelve-bit values. Any division that results in twelve-bit values being assigned to both TOP SEQUENCE 102 and BOTTOM SEQUENCE 104 is acceptable.

TOP SEQUENCE 102 is input to top encoder 106 and BOTTOM SEQUENCE 104 is input to bottom encoder 108. Top encoder 106 and bottom encoder 108 are preferably identical to each other and encode their respective sequences in an identical manner. In preferred embodiments, top encoder 106 and bottom encoder 108 are 12/15 trellis encoders that produce a matched spectral null code as discussed further below. As a result of this encoding, top encoder 106 produces TOP CODED SEQUENCE 110 and bottom encoder 108 produces BOTTOM CODED SEQUENCE 112, which in preferred embodiments are sequences of 15-bit codewords.

TOP CODED SEQUENCE 110 and BOTTOM CODED SEQUENCE 112 are input to interleaver 114, which also receives BIT CLOCK 46 and WRITEGATE 122. Interleaver 114 interleaves the bits of TOP CODED SEQUENCE 110 with the bits of BOTTOM CODED SEQUENCE 112 on a bit-by-bit basis in a manner explained below. The interleaved sequence of bits is output as ENCODED DATA 26 at a rate set by BIT CLOCK 46. The interleaving is such that ENCODED DATA 26 is constructed from alternating bits of TOP CODED SEQUENCE 110 and BOTTOM CODED SEQUENCE 112.

Figure 5:
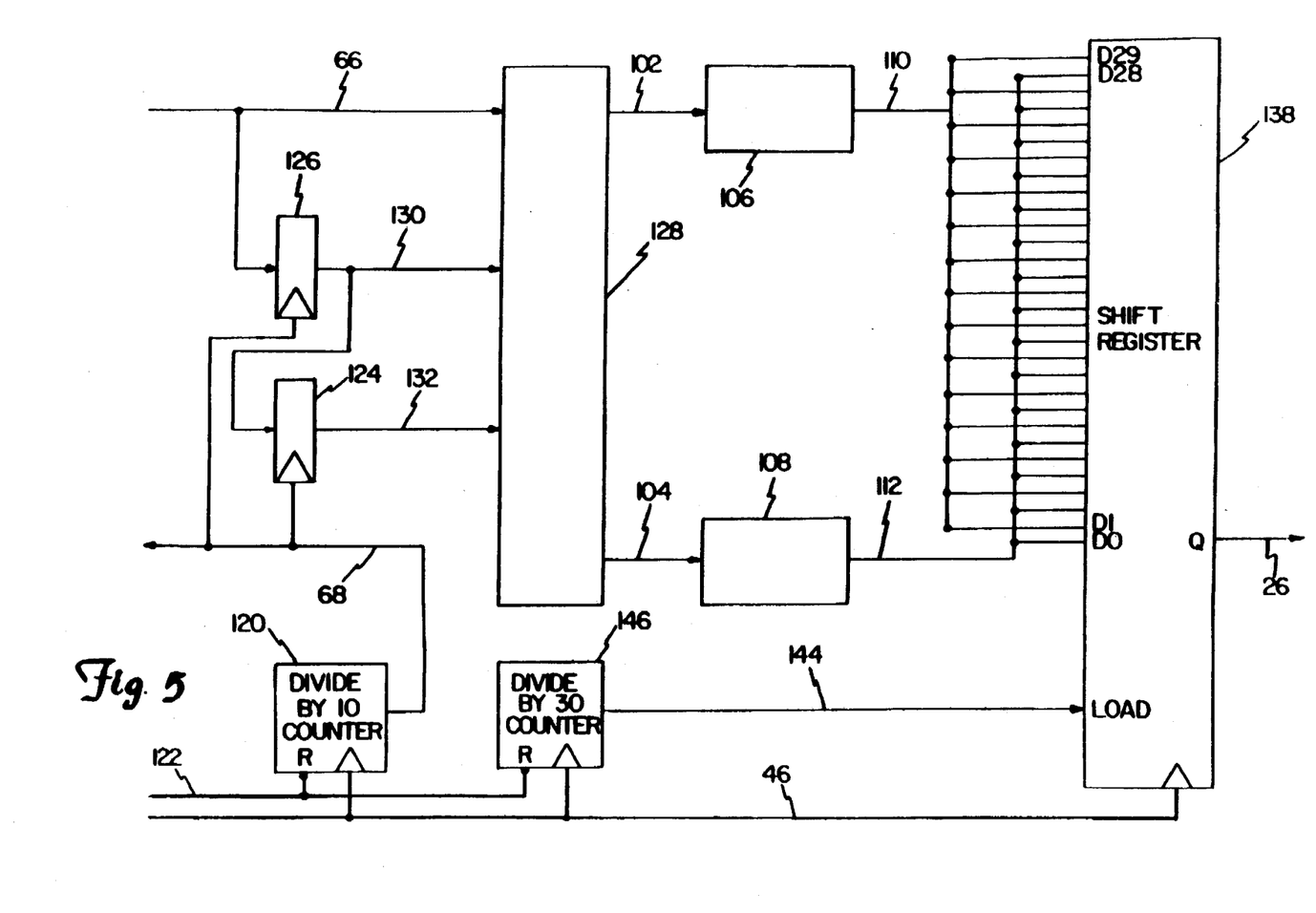
FIG. 5 is a more detailed diagram of matched spectral null encoder 64 of FIGS. 2 and 4.

FIG. 5 is a more detailed diagram of the preferred embodiment of matched spectral null encoder 64 of FIG. 4. In FIG. 5, encoder map 100 of FIG. 4 is constructed from first-byte register 124, second-byte register 126, partitioner 128, and divide-by-ten counter 120.

Divide-by-ten counter 120 is driven by BIT CLOCK 46 and is reset by the inverse of WRITEGATE 122. For every ten pulses on BIT CLOCK 46, divide-by-ten counter 120 produces one pulse on BYTE CLOCK 68, which controls the loading of first-byte register 124 and second-byte register 126. Under the control of BYTE CLOCK 68, INTERLEAVED ECC DATA 66 enters matched spectral null encoder 64 on an eight-bit bus, one byte per BYTE CLOCK cycle. The eight-bit bus is connected to partitioner 128 and the input of second-byte register 126. At the first pulse of BYTE CLOCK 68, the first byte of INTERLEAVED ECC DATA 66 is loaded into second-byte register 126. After a short propagation delay (significantly less than a BYTE CLOCK period), this value appears at second-byte bus line 130, which is the eight-bit bus output of second-byte register 126. Second-byte bus line 130 is input to partitioner 128 and first-byte register 124.

With the next pulse on BYTE CLOCK 68, the byte value on second-byte bus line 130 is loaded into first-byte register 124 and after a short propagation delay appears on first-byte bus line 132, which is the eight-bit bus output of first-byte register 124. This BYTE CLOCK pulse also causes the next byte of INTERLEAVED ECC DATA 66 to be loaded into second-byte register 126 and, after a short delay (again, significantly less than a BYTE CLOCK period), this next byte appears on second-byte bus line 130. This pulse on BYTE CLOCK 68 also prompts interleaver buffer 62 for another byte of INTERLEAVED ECC DATA 66 which appears at the input to partitioner 128 and the input of second-byte register 126 after the previous byte appears on second-byte bus line 130.

At this point, first-byte bus line 132, second-byte bus line 130, and INTERLEAVED ECC DATA 66, together carry a set of three bytes that appeared consecutively in INTERLEAVED ECC DATA 66. These three bytes together form 24 consecutive bits of data and/or ECC values. These 24 bits are divided by partitioner 128 into two 12 bit words that are placed on TOP SEQUENCE 102 and BOTTOM SEQUENCE 104 respectively. As discussed previously, the division can be made on any basis. TOP SEQUENCE 102 and BOTTOM SEQUENCE 104 are 12-bit bus lines that are input to top encoder 106 and bottom encoder 108 respectively. The two encoders encode each 12-bit word into a 15-bit codeword to produce TOP CODED SEQUENCE 110 and BOTTOM CODED SEQUENCE 112 which are carried on 15-bit bus lines. In preferred embodiments, the encoders are 12/15 trellis encoders which create matched spectral null codewords in a manner described further below. The encoders also preferably use a NRZ coding scheme where each "1" in the 15-bit codewords represents one direction of magnetization on the disc, and each "0" represents an opposite direction of magnetization to suit the writing circuitry of the magnetic disc. For reference, the directions of magnetization are referred to as the "+1" and "−1" directions.

Each codeword within TOP CODED SEQUENCE 110 and BOTTOM CODED SEQUENCE 112 is input to shift register 138 which serves as interleaver 114 of FIG. 4. Each of the conductors in the 15-bit bus line carrying TOP CODED SEQUENCE 110 is interleaved with each of the conductors in the 15-bit bus line of BOTTOM CODED SEQUENCE 112 at the inputs of shift register 138 by alternating connections of these conductors from each bus to successive inputs. Thus, input D0 is the first bit of BOTTOM CODED SEQUENCE 112 and D1 is the first bit of TOP CODED SEQUENCE 110. Likewise, D28 is the last bit of BOTTOM CODED SEQUENCE 112 and D29 is the last bit of TOP CODED SEQUENCE 110.

The values of TOP CODED SEQUENCE 110 and BOTTOM CODED SEQUENCE 112 are loaded into shift register 138 at each positive going transition received in the signal LOAD 144 at the load input of shift register 138. LOAD 144 is created by divide-by-30 counter 146, which produces one controlling transition for every thirty pulses on BIT CLOCK 46. The shifting of shift register 138 is controlled by BIT CLOCK 46 which is received at the clock input of shift register 138. With each clock pulse on BIT CLOCK 46, a different bit in shift register 138 is output from the shift register at serial output Q. After 30 pulse on BIT CLOCK 46, all 30 bits from the two 15-bit codewords of BOTTOM CODED SEQUENCE 112 and TOP CODED SEQUENCE 110 have been output through serial output Q. This produces ENCODED DATA 26, a serial, interleaved representation of the 15-bit codewords in each of TOP CODED SEQUENCE 110 and BOTTOM CODED SEQUENCE 112.

Figure 6:
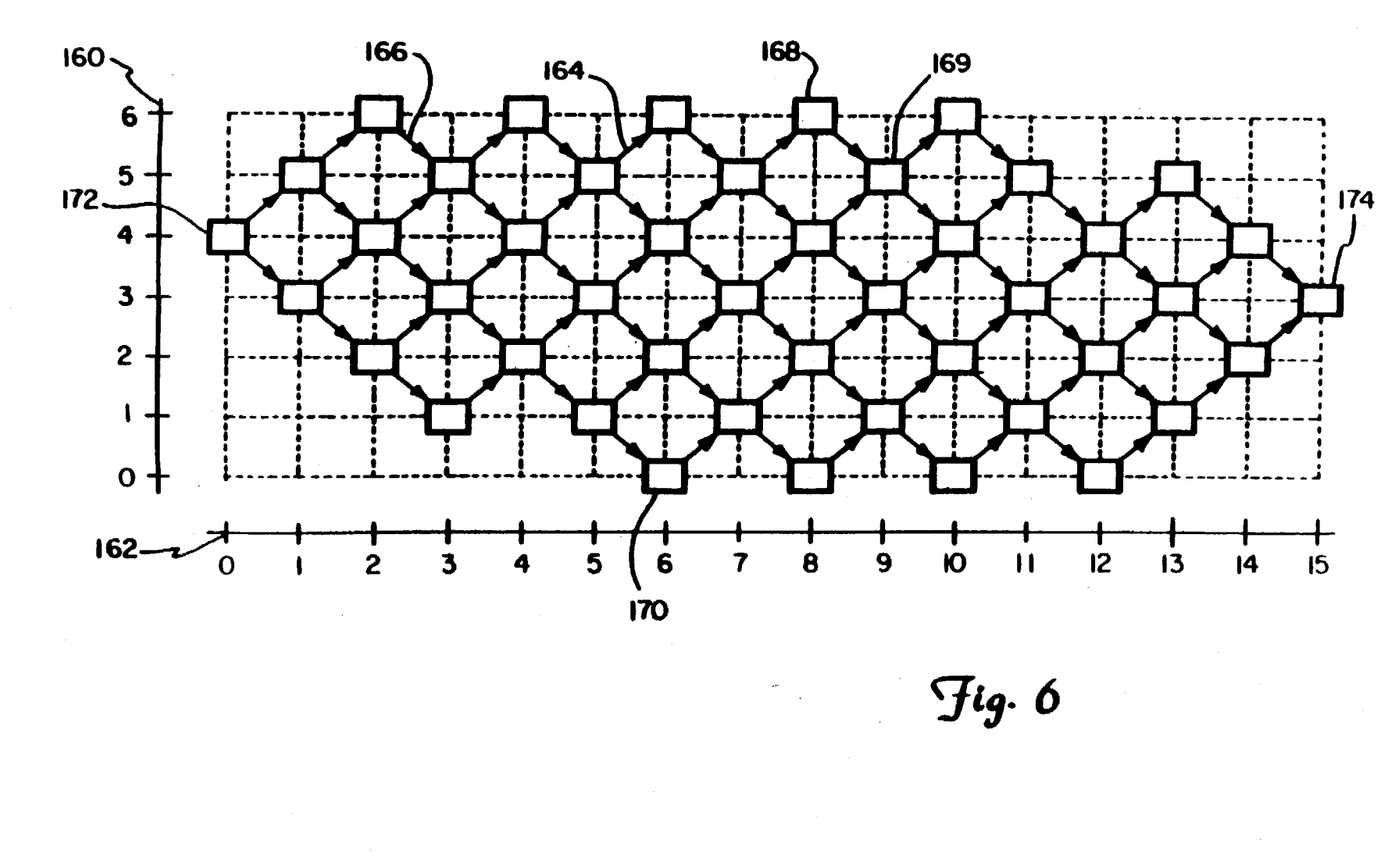
FIG. 6 is a trellis diagram demonstrating the encoder rules of encoders 106 and 108 of FIGS. 4 and 5.

FIG. 6 is one embodiment of a trellis diagram for the encoding process used in top encoder 106 and bottom encoder 108 of FIG. 5. The trellis diagram has a vertical axis 160 that has values from zero to six representing a running digital sum. The running digital sum is an integer value that has an initial value of four and is incremented or decremented by a value of 1 for each chosen bit in the codeword as described below. Horizontal axis 162 represents 15 time periods with one digit of the 15 bit codeword being selected at each time period. The boxes shown in FIG. 6 represent running digital sum values at each time period with the arrows between boxes representing valid transitions from one time period to the next. Upward diagonal arrows, such as arrow 164, represent +1's at the channel input corresponding to one direction of magnetization on the disc. Using NRZ coding, such +1's are represented by 1's in the 15-bit codewords. Downward diagonal arrows, such as arrow 166, represent −1's at the channel input corresponding to the opposite direction of magnetization. Using NRZ coding, such −1's are represented by 0's in the 15-bit codewords. For each upward diagonal arrow, 1 is added to the running digital sum and for each downward diagonal arrow, 1 is subtracted from the running digital sum.

The trellis of FIG. 6 has a running digital sum constraint that forbids the running digital sum from being greater than 6 or less than zero. Thus, in maximum state 168, the only allowable transition is to state 169, a transition that represents a −1 at the channel input and a reduction in the running digital sum. Similarly, the transition from minimum state 170 must produce a +1 so that the running digital sum will increase from 0 to 1.

Each unique path through the trellis of FIG. 6 represents one possible 15-bit codeword in TOP CODED SEQUENCE 110 or BOTTOM CODED SEQUENCE 112 for each corresponding 12-bit word obtained from the ECC encoded and interleaved bytes used as an input to one of top and bottom encoders 106 and 108, with the exception that none of the trellis codewords may have a string of six identical digital values. The generation of each trellis codeword begins with a running digital sum of four at state 172 as an initial reference and ends with a running digital sum of three at state 174. Because there are 15 bits in each trellis codeword, there will always be an unequal number of "+1's" and "−1's" represented by each such codeword. Specifically, there will be 8"−1's" and 7"+1's" represented in each trellis codeword produced by trellis 163 of FIG. 6.

The distribution of "+1's" and "−1's" in ENCODED DATA 26 determines the spectral power density of the trellis code. As discussed earlier, each encoder preferably produces a coded signal with a spectral power density that matches the spectral response of a dicode channel (1−D). Since dicode channels have nulls in their spectral response at zero frequency (D.C.) and the recording frequency, each trellis encoder preferably has zero spectral power density at these frequencies. Because each codeword produced by trellis 163 represents one more −1 than +1, its spectral power density has a spike at D.C. instead of a zero at D.C. null. If the codewords from both trellis encoders were simply interleaved to produce ENCODED DATA 26, that interleaved signal would also have a spectral response with a spike at DC.

To remove this spike, the present invention inverts the binary values of every other codeword from top encoder 106 and bottom encoder 108. Inverting the codewords makes the number of represented "+1's" and "−1's" equal over any two consecutive codewords from a particular encoder. This reduces the spectral power density to zero at DC. The inversion is performed within top encoder 106 and bottom encoder 108 of FIG. 5.

Figure 7:
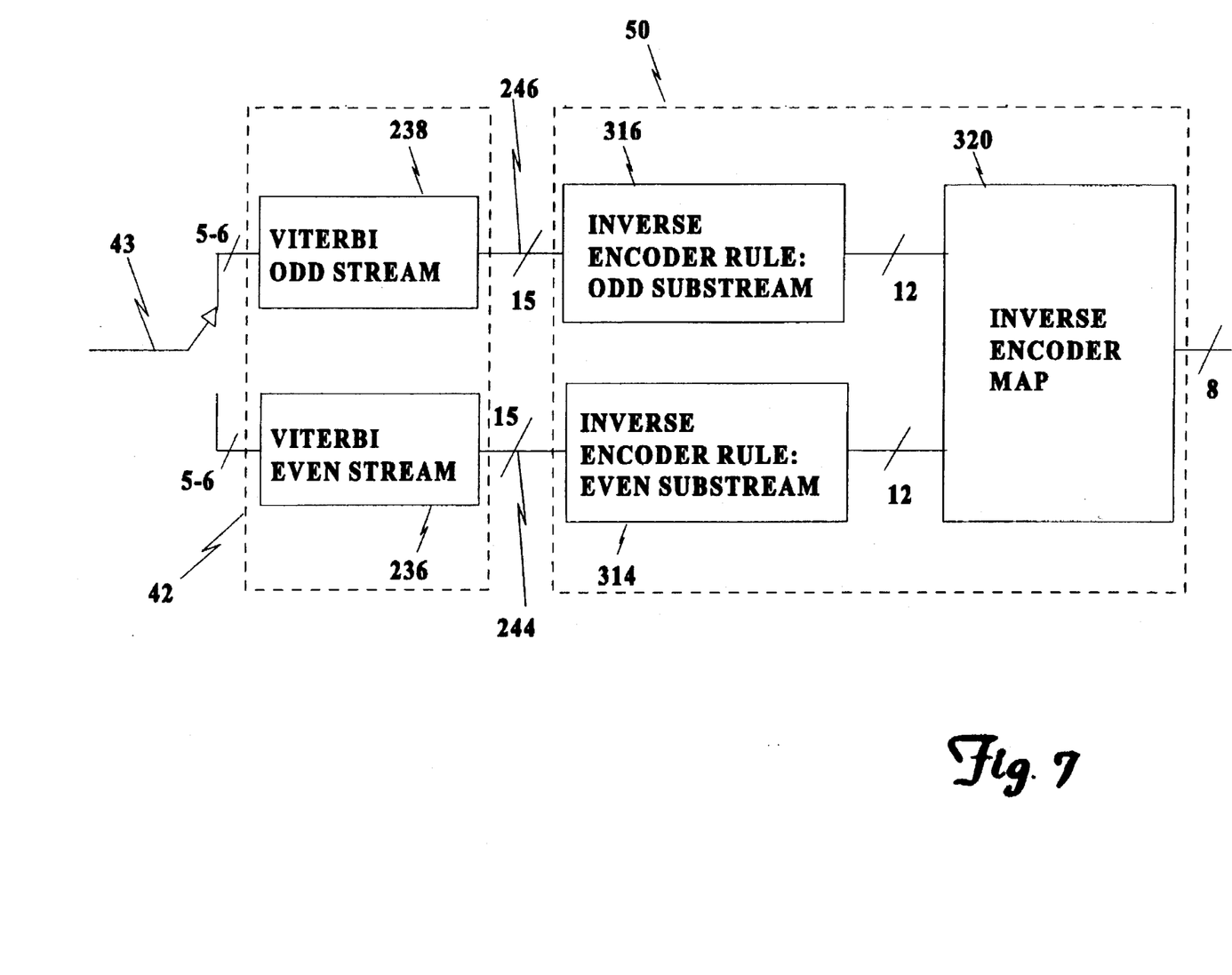
FIG. 7 is a block diagram of detector 42 and decoder 50 of FIG. 1.

FIG. 7 is a block diagram of detector 42 and decoder 50 of FIG. 1. Detector 42 uses two parallel Viterbi detectors to detect codewords in DIGITAL SAMPLES 43. The two parallel Viterbi detectors, Even Viterbi Detector 236 and Odd Viterbi Detector 238, receive DIGITAL SAMPLES 43 on five-bit or six-bit input buses and output a series of codewords on 15-bit buses. The two Viterbi detectors accept alternate samples on DIGITAL SAMPLES 43. For instance, Even Viterbi Detector 236 receives samples 0, 2, 4, 6, 8 . . . and Odd Viterbi Detector 238 receives samples 1, 3, 5, 7 . . . . Thus, the samples in DIGITAL SAMPLES 43 are deinterleaved as they enter the Viterbi Detectors.

Before being deinterleaved, the signal on DIGITAL SAMPLES 43 preferably matches a PR4 channel output denoted as $(1-D^2)$ where 1 is the input signal and $D^2$ is the input signal delayed by two BIT CLOCK pulses. Such a signal is the same as two interleaved (1−D) signals, where D represents one delay. Thus, after deinterleaving, each Viterbi detector receives a noisy (1−D) channel signal at its input.

Even Viterbi Detector 236 and Odd Viterbi Detector 238 each receive a large number of samples before producing EVEN CODEWORDS 244 and ODD CODEWORDS 246, respectively, which are input to decoder 50. EVEN CODEWORDS 244 and ODD CODEWORDS 246 are the codewords the Viterbi Detectors detected in the sequence of samples and represent the most likely codewords in light of the samples.

The full codewords on EVEN CODEWORDS 244 and ODD CODEWORDS 246 are input to Even Inverse Encoder 314 and Odd Inverse Encoder 316. Both inverse encoders use a trellis decoder to decode each codeword according to the inverse of the encode rules used by the encoders of FIG. 4. Based on the encode rules, Inverse Encoders 314 and 316 produce twelve bits of user data and ECC code for each codeword. These values are output on two separate buses, one for each encoder, that are both coupled to Inverse Encoder Map 320.

Inverse Encoder Map 320 combines the two twelve-bit values by inverting the map that partitioner 128 of FIG. 5 uses to divide twenty-four consecutive bits of user data and ECC code into two 12-bit symbols. After the twenty-four bits have been combined, Inverse Encoder Map 320 produces three serial bytes. These three bytes represent the three bytes used to construct the two interleaved codewords in matched spectral null encoder 64 of FIG. 2.

Figure 8:
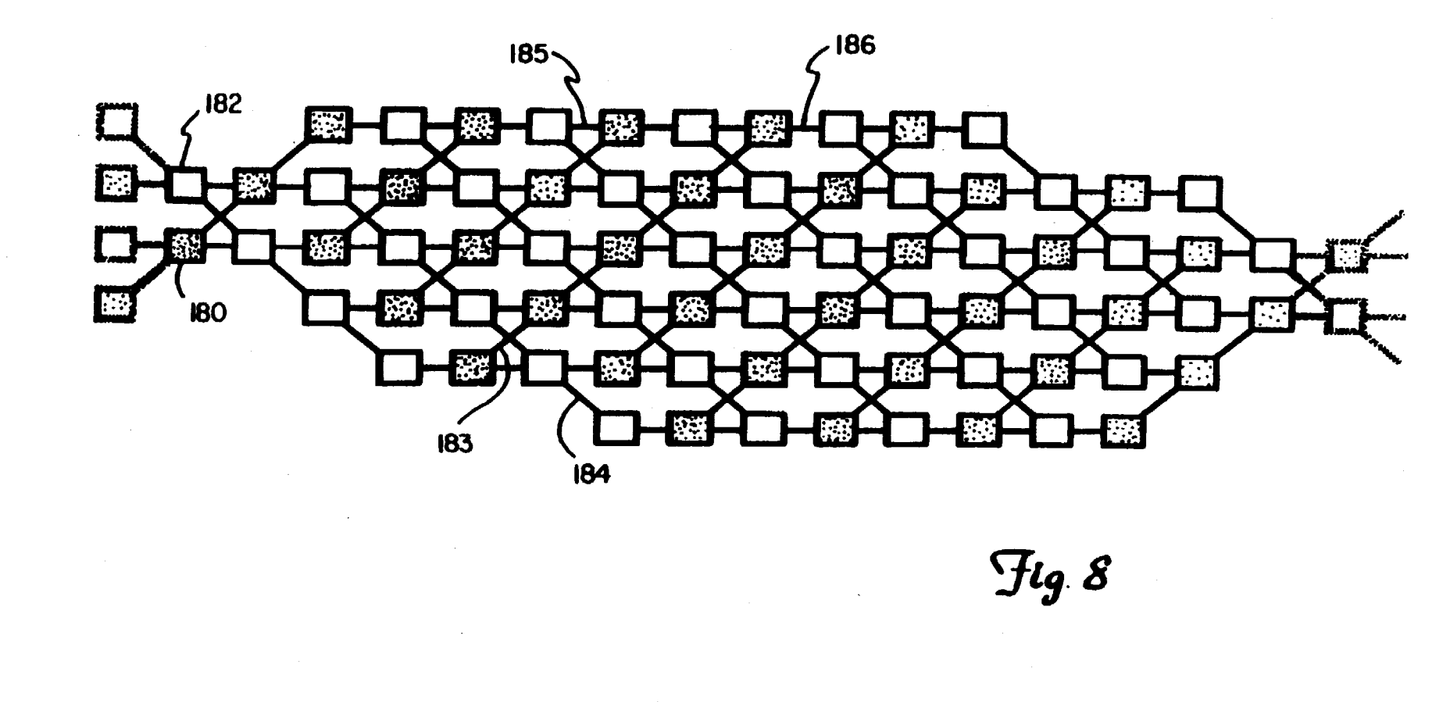
FIG. 8 is a Viterbi Detector trellis used to detect codewords in read equalized signal 40 of FIG. 1.

FIG. 8 is a diagram of a Viterbi Detector Trellis for use in Viterbi Detectors 236 and 238 of FIG. 7. The Viterbi Detector Trellis of FIG. 8 has two states for each of the states shown in the trellis diagram of FIG. 6. One state is indicated by a shaded box and the other state is represented by a non-shaded box. The shaded boxes indicate that the previous channel bit represented a +1 direction of magnetization and the non-shaded boxes indicate that the previous channel bit represented a −1 direction of magnetization. For instance, shaded box 180 and non-shaded box 182 are the split states for state 172 of FIG. 6. If the channel bit leading to state 172 represented a +1, the Viterbi Detector Trellis would be in state 180. However, if the bit previous to state 172 represented a −1, the Viterbi Detector Trellis of FIG. 8 would be in state 182.

As discussed earlier, channel 32 is preferably a PR4 channel that ideally has a transfer characteristic of $(1-D^2)$, where "1" represents WRITE signal 30 and $D^2$ represent the write signal delayed by two time units. This means that READ signal 34 will ideally be a $1-D^2$ representation of WRITE signal 30 of FIG. 1. Those skilled in the art will recognize that a $(1-D^2)$ transfer function is the same as two interleaved (1−D) transfer functions. Thus, if READ signal 34 is deinterleaved, as shown in FIG. 7, it produces two (1−D) signals. This means that the signal received at each Viterbi Detector is equivalent to a series of channel input bits minus that series delayed by one time unit.

The signals at the Viterbi Detectors are not perfect 1–D representations of WRITE signal 30 because READ signal 34 is passed through read equalizer 38, which equalizes the signal so that it has expected sample values of +1, −1 and 0. In addition, NOISE 36 of FIG. 1 corrupts READ signal 34. The Viterbi Detectors compensate for this by detecting signals that are close to +1 as a transition from "−1" to "+1" in WRITE signal 30; values close to "0" as no transition in WRITE signal 30; and values close to "−1" as a transition from "+1" to "−1".

Thus, a value near "0" generally indicates that the channel bit remains the same. Detected "0's" are depicted on the detector trellis as any path between two consecutive shaded boxes, such as path 183, or any path between two consecutive non-shaded boxes, such as path 184. A detected "+1" is shown on the detector trellis as a path from a non-shaded box to a shaded box, such as path 185, and a detected "−1" is shown as a path from a shaded box to a non-shaded box, such as path 186.

Figure 9:
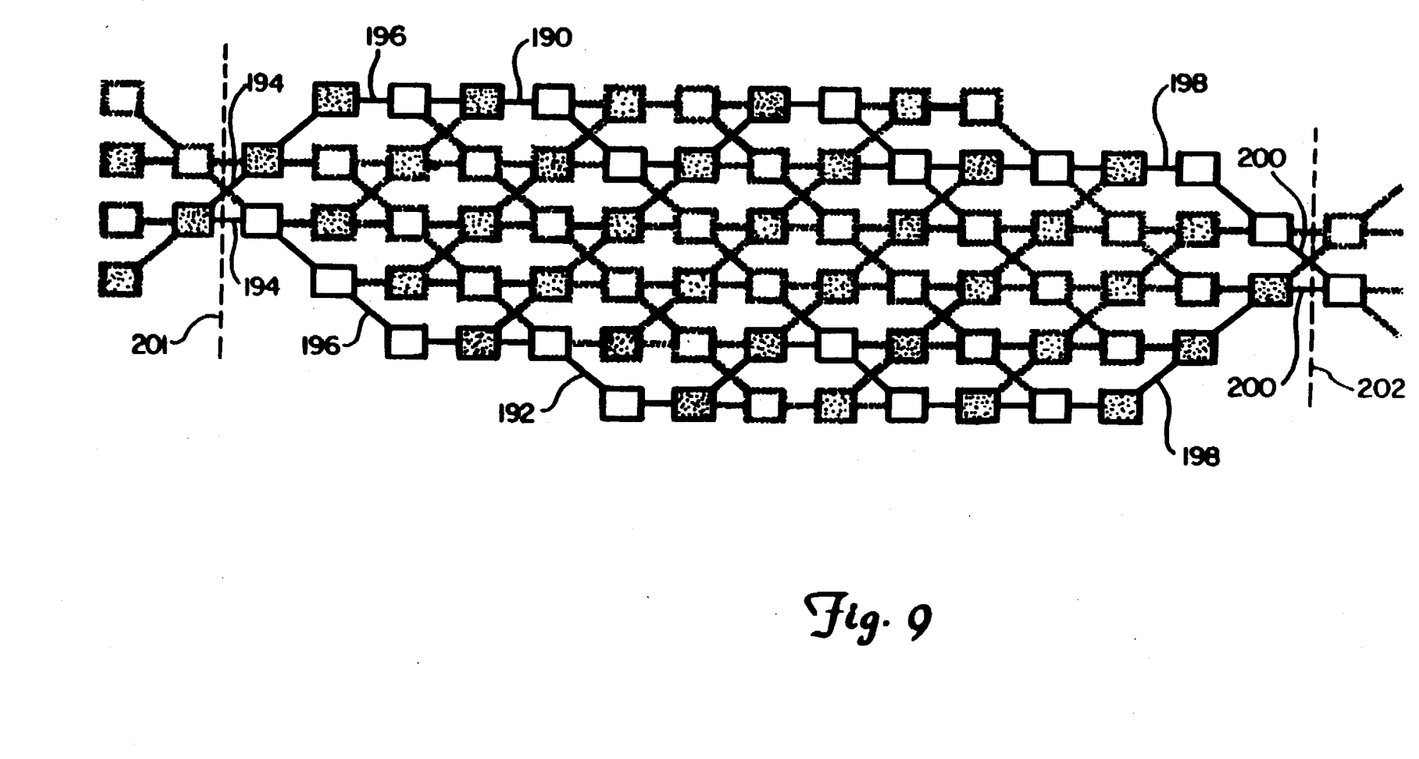
FIG. 9 is a minimum distance error event in the Viterbi Detector trellis of FIG. 8.

FIG. 9 shows the Viterbi Detector Trellis of FIG. 8 with a minimum distance error event of maximum length for the trellis code of the present invention. A minimum distance error event is the most likely error event that can occur and still produce valid codewords. The minimum distance of a code is the minimum sum-of-squared differences between noiseless samples corresponding to two different paths in the trellis. For the trellis code of the present invention, the minimum distance of the code is 4.

The depiction of a minimum distance error event appears as two pathways depicted as solid black lines through the detector trellis. In FIG. 9, first path 190 and second path 192 are both valid codewords. The data streams which produce first path 190 and second path 192 differ from each other in four different instances by a value of 1. The sum of the squares of these differences equals 4, which is the minimum distance error for this trellis code. These four differences are marked as error events 194, 196, 198 and 200. Note that the minimum distance error event does not cross codeword boundaries, 201 and 202. The two paths are forced back together at codeword boundary 202 before the beginning of the next codeword. This ensures that a burst error will not cross codeword boundaries, thus ensuring that the error will not affect the proper detection of other pairs of interleaved codewords.

Because minimum distance error events are contained within one codeword, burst errors will be limited to one codeword. When the codewords are later decoded and recombined into three bytes of ECC Data, the fact that burst errors have been contained to one codeword means that the burst errors will be contained to three bytes of ECC code and user data. Thus, no one burst error will consume all of the ECC code's ability to correct errors.

Although the present invention has been described with reference to preferred embodiments, workers skilled in the art will recognize that changes may be made in form and detail without departing from the spirit and scope of the invention.

What is claimed is:

1. A trellis encoding method that produces codewords that are combined in pairs, the two codewords in each pair together being encoded from three consecutive bytes of data and Reed Solomon error correction code values, the three bytes being from separate blocks of user data and Reed Solomon error correction code values, the Reed Solomon error correction code values being capable of correcting up to two bytes of user data and error correction code values per block.

2. A digital communication apparatus for transmitting sectors of digital units, each sector comprising a series of blocks and each block including error correction values used to detect and correct errors within the block, the error correction values being useful in correcting up to a maximum number of digital units, the digital communication apparatus comprising:

an encoding system, for producing an encoded series of digital values from the blocks of digital units, the encoded series of digital values comprising sections of interleaved codewords, each codeword in each section being encoded apart from other codewords in the section, the codewords of a section of interleaved codewords together encoded from a set of digital units, each set of digital units including at most one digital unit from each block in a sector;

a channel, coupled to the encoding system to receive the encoded series of digital values and to produce a representation of the encoded series, the channel capable of occasionally introducing burst errors into the representation of the encoded series; and a decoding system, coupled to the channel to produce a representation of the blocks of digital units received by the encoding system, the decoding system's representation being based on the channel's representation of the encoded series.

3. The digital communication apparatus of claim 2 wherein the channel is a magnetic recording device.

4. The digital communication apparatus of claim 2 wherein the decoding system comprises:

a deinterleaver, for dividing the channel's representation into two data streams;

two parallel detectors each receiving one of the data streams from the deinterleaver and each producing a stream of codewords based on the respective data stream; and decoder means, coupled to the detectors, for generating the decoding system's representation of the encoded series from the series of codewords produced by the detectors.

5. The digital communication apparatus of claim 2 wherein the encoding system comprises:

a partitioning means, for partitioning the digital units by dividing sets of digital units into two series of partitioned values, each set of digital units having one digital unit from each block in a sector;

two encoder means, each coupled to the partitioning means and each receiving one of the series of partitioned values, each encoder means translating each series of partitioned values into a series of codewords; and an interleaver, coupled to both encoder means and interleaving the series of codewords from the two encoder means into the encoded series of digital values.

6. The digital communication apparatus of claim 5 wherein the channel has a spectral response with nulls for at least one frequency and the encoded series of digital values has a spectral power density of nearly zero for at least one frequency that matches a frequency at which the channel's spectral response has a null.

7. The digital communication apparatus of claim 6 wherein each series of codewords has a null at a first frequency and the encoded series of digital values has a null at a second frequency.

8. An encoding apparatus for encoding user data and error correction values for transmission across a channel, the user data and error correction values associated with one of a plurality of blocks of user data and error correction values, the error correction values capable of correcting errors within their respective blocks, the encoding apparatus comprising:

partitioning means for partitioning the user data and error correction values into a plurality of channels, the number of channels less than the number of blocks;

encoder means, coupled to the partitioning means, for encoding the partitioned user data and error correction values into codewords; and combining means for combining each codeword with at least one other codeword to form a codeword combination, each codeword combination such that two burst errors localized within two separate codeword combinations will not cause more errors than the error correction values can correct.

9. The encoding apparatus of claim 8 wherein a series of combined codewords has a spectral power density that matches a spectral response of the channel.

10. The encoding apparatus of claim 8 wherein the encoding means comprises two parallel encoders.

11. The encoding apparatus of claim 10 wherein the combining means combines codewords in pairs and the two codewords in each pair are together encoded from three bytes of user data and error correction values, the three bytes being each from separate blocks of user data and error correction values, the error correction values being capable of correcting up to two bytes of user data and error correction values per block.

12. A method of transmitting digital words of user data and error correction code through a channel, the method comprising:

dividing the user data and error correction code into at least two streams of digital values;

encoding each stream of digital values into a stream of codewords, where each codeword is delimited by codeword boundaries such that minimum distance errors do not cross codeword boundaries;

combining at least two streams of codewords into a combined stream of codewords, the combined stream of codewords being such that a single minimum distance error in the channel will corrupt beyond recognition at most a number of codewords that together represent fewer digital words than the number of digital words the error correction code can correct; and transmitting the combined stream of codewords through the channel.

13. The method of claim 12 wherein dividing the user data and error correction code comprises dividing at least one digital word of user data and error correction code into at least a first portion and a second portion, and placing the first portion in a first stream of digital values and the second portion in a second stream of digital values.

* * * * *

UNITED STATES PATENT AND TRADEMARK OFFICE
CERTIFICATE OF CORRECTION

PATENT NO. : 5,691,993
DATED : NOVEMBER 25, 1997
INVENTOR(S) : LISA FREDRICKSON

It is certified that error appears in the above-indentified patent and that said Letters Patent is hereby corrected as shown below:

Col. 10, line 1, delete "alternate samples on"

Col. 10, line 8, delete "$(1-\!\!-D^2)$", insert --$(1-D^2)$--.

Signed and Sealed this

Seventeenth Day of November, 1998

Attest:

BRUCE LEHMAN

*Attesting Officer*  *Commissioner of Patents and Trademarks*